United States Patent [19]

Suzuki et al.

[11] Patent Number: 4,642,508

[45] Date of Patent: Feb. 10, 1987

[54] PIEZOELECTRIC RESONATING DEVICE

[75] Inventors: Hitoshi Suzuki, Yokohama; Hiroaki Sato, Fujisawa, both of Japan

[73] Assignee: Kabushiki Kaisha Toshiba, Japan

[21] Appl. No.: 709,600

[22] Filed: Mar. 8, 1985

[30] Foreign Application Priority Data

Mar. 9, 1984 [JP] Japan ................................. 59-44122

[51] Int. Cl.$^4$ ............................................ H01L 41/08
[52] U.S. Cl. ...................................... 310/321; 310/324
[58] Field of Search ................................. 310/321, 324

[56] References Cited

U.S. PATENT DOCUMENTS

| 3,486,046 | 12/1969 | Zalar | 310/324 |
| 4,456,850 | 6/1984 | Inoue et al. | 310/324 |
| 4,502,932 | 3/1985 | Kline et al. | 310/321 X |
| 4,517,486 | 5/1985 | Andrews | 310/321 X |
| 4,531,267 | 7/1985 | Royer | 310/324 X |

FOREIGN PATENT DOCUMENTS

| 46-25579 | 7/1971 | Japan . | |
| 0031609 | 2/1983 | Japan | 310/324 |
| 58-29211 | 2/1983 | Japan . | |
| 0137318 | 8/1983 | Japan | 310/324 |
| 0175314 | 10/1983 | Japan | 310/324 |

OTHER PUBLICATIONS

1982 Ultrasonics Symposium—IEEE Cat. #02C1-1 1020-4, p. 466, Thin Film Resonators and Filters—K. M. Lakin et al.

Primary Examiner—Mark O. Budd
Attorney, Agent, or Firm—Banner, Birch, McKie & Beckett

[57] ABSTRACT

The present invention provides a piezoelectric thin-film resonator comprising a non-piezoelectric film layer formed on a substrate, a lower electrode, a piezoelectric film layer and an upper electrode. An air-gap layer is formed between the non-piezoelectric film and the substrate to facilitate vibration of the piezoelectric film layer at the resonate frequency. The resulting resonating device is mechanically strong while at the same time being capable of operating at high frequency.

17 Claims, 10 Drawing Figures

PIEZOELECTRIC RESONATING DEVICE

BACKGROUND OF THE INVENTION

The present invention relates generally to the field of resonating devices, and more particularly, is directed to a piezoelectric resonator and piezoelectric filter which are manufactured using thin film technology in order to obtain a high resonant frequency.

In recent years, great progress has been made in the areas of material and process technology for making electronic components such as integrated circuits. As a result, the use of electronic circuitry in manufactured goods has increased over the years and continues to increase at a rapid rate. Unfortunately, advances in passive component parts, such as resonators and filters, have not kept pace. One example of this is the presently unfulfilled need for a compact resonator for communications use in the VHF or UHF bands.

Conventional resonators and filters employing a vibrating piezoelectric substrate, such as crystal, are widely known in the art. Vibrating frequency is a function of substrate thickness. However, the thickness of such a substrate can only be reduced to about several tens of microns in order to maintain sufficient mechanical strength of the substrate. The thickness of the substrate is also limited by present manufacturing and process technology. Thus the upper resonant frequency limit of a conventional resonator is typically only about several tens of MHz. With a piezoelectric substrate, a higher resonate frequency can usually only be obtained by employing a higher-mode vibration. However, the higher the mode, the smaller the electromechanical coupling coefficient becomes, and thus the frequency bandwidth becomes narrower. It is therefore not practical to use a conventional piezoelectric substrate at a higher mode.

A resonator employing a so-called piezoelectric thin-film has recently been proposed for the purpose of making a compact VHF/UHF-band resonator which operates in the fundamental mode or at a relatively low frequency overtone. An example of such a piezoelectric thin-film resonator is disclosed in an article entitled "ZnO/SiO2-Diaphragm Composite Resonator on a Silicon Wafer" published in Electronics Letter, July 9, 1981, Vol. 17, No. 14, pp. 507–509. FIGS. 1 and 2 of the present drawings illustrate the structure of this type of piezoelectric thin-film resonator. FIGS. 1 and 2 are perspective and cross-sectional views, respectively, of a piezoelectric thin-film resonator which employs zinc oxide (ZnO) as the piezoelectric film. This type of resonator is manufactured as follows. Film layers 2 and 3 are made of SiO2 and are formed on opposing sides of a silicon substrate 1. A portion of film layer 3 is removed from the substrate. Using film layer 2 and the remaining portion of Cfilm layer 3 as a mask, substrate 1 is anisotropically (crystal orientation dependent) etched to form a concave portion 4. Concave portion 4 is etched completely through substrate 1 to film layer 2 as shown in FIG. 2. A first electrode 5 is then formed on film layer 2 with a ZnO piezoelectric thin-film layer 6 formed over film layer 2 partially covering first electrode 5. A second electrode 7 is formed on thin-film layer 6 with at least a part of second electrode 7 over first electrode 5.

When a signal is applied to electrodes 5 and 7, the composite film, consisting of thin-film layer 6 and film layer 2 over concave portion 4, vibrates due to the piezoelectric effect of thin-film layer 6 and thus operates as a resonator.

This type of piezoelectric thin-film resonator has the following features:

(1) It can operate over a frequency range from 100 MHz to several GHz in the fundamental and lower overtone mode because its vibrating portion can be made extremely thin.

(2) It has a high electromechanical coupling coefficient and, thus can be designed to have a wide frequency bandwidth.

(3) It can be designed to have a zero temperature coefficient; i.e., designed such that the SiO2 film layers have a resonant frequency temperature coefficient oppoiste to the resonant frequency temperature coefficient of the piezoelectric film layer.

(4) It can be designed to be very compact in size.

(5) It can be readily assembled in an integrated circuit because the manufacturing process for making the resonator is compatible with the manufacturing process used to make common integrated circuits.

Though piezoelectric thin-film resonators having a concave portion in the silicon substrate have the above-described advantages, they also have a number of deficiencies. When the exposed surface of a silicon substrate is etched in PED liquid [pyrocatechine (pyrocatecol) $C_6H_4(OH)_2$, ethylene diamine $NH_2(CH_2)_2NH_2$, and water, $H_2O$], a pyramid shaped void 4 is formed as shown in FIG. 2. This is because the liquid is highly anisotropic with respect to the rate of etching i.e., the rate of etching is higher along the (100) orientation of the substrate than along the (111) orientation of the substrate. Since the rate of etching along the (100) orientation of a silicon substrate can be as low as 50 microns per hour, it would take eight hours to etch a common silicon substrate having a diameter of three inches and a thickness of 400 microns. This is, of course, not suitable for mass production. Moreover, because a concavity is formed in the substrate, the mechanical strength of the substrate is also reduced. As a result, the substrate requires very delicate handling during the manufacturing process. In addition, where other circuit elements are formed on the same substrate, the process of forming the concavity in the substrate may damage these circuit elements.

SUMMARY OF THE INVENTION

It is the object of the present invention to provide piezoelectric resonating device which can be mass produced and has high mechanical strength.

It is a further object of the present invention to provide a piezoelectric resonating device which can be readily formed on an integrated circuit substrate without damage to other circuit elements.

The foregoing objects are achieved by forming an air-gap between a non-piezoelectric thin film layer and a substrate and by providing a piezoelectric film layer on the thin film layer over the air-gap. At least one pair of electrodes are provided with the piezoelectric film layer between them.

Since the thin-film vibration portion is formed over the air-gap, a long etching process for the silicon substrate is not required. Consequently, the production process may be greatly reduced in time, i.e., mass production is readily accomplished, and other integrated circuits may be easily assembled on the same substrate. In addition, since the manufacturing process does not reduce the original mechanical strength of the substrate, the resonating device is not fragile to handle, thereby increasing the yield rate of production devices.

Compared with a conventional resonator, vibration energy leakage to the substrate is greatly reduced. This improves the performance of the resonator. In addition, since the air-gap can be formed in an arch shape, the resonator can withstand greater vibrational shock than conventional resonators.

DETAILED DESCRIPTION OF THE PREFERRED EMBODIMENT

Figure 1:
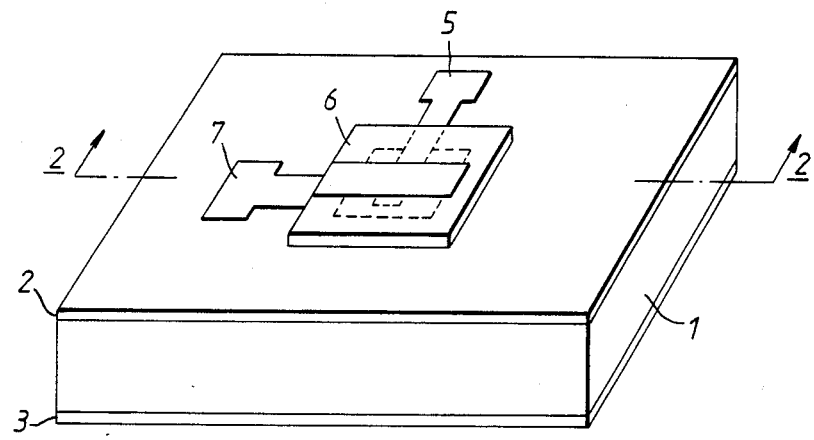
FIG. 1 is a perspective view of a conventional piezoelectric thin-film resonator.
Figure 2:
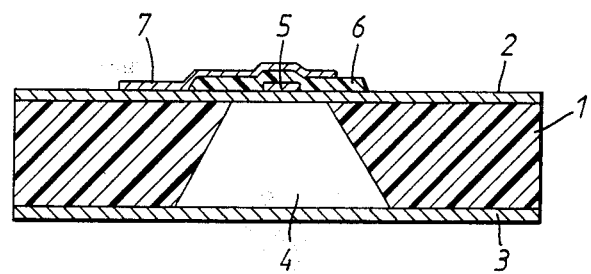
FIG. 2 is a cross-sectional view taken along line 2—2 in FIG. 1.
Figure 3:
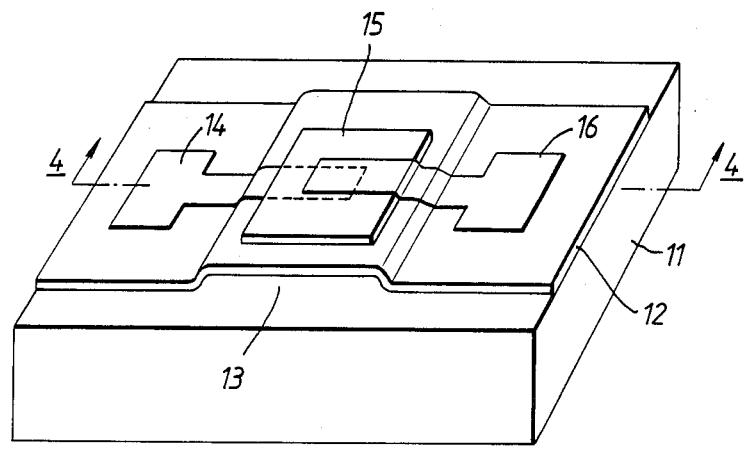
FIG. 3 is a perspective view of one embodiment of a resonator in accordance with the present invention.
Figure 4:
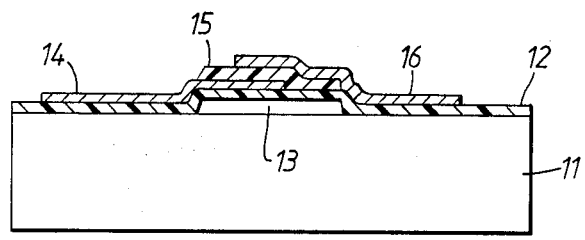
FIG. 4 is a cross-sectional view taken along line 4—4 in FIG. 3.

With reference to FIGS. 3 and 4, perspective and cross-sectional views of a first embodiment of a piezoelectric thin-film resonator in accordance with the present invention are shown. As shown, an $SiO_2$ film layer 12 is provided on a substrate 11 with an air-gap 13 formed between film 12 layer and substrate 11. $SiO_2$ film layer 12 and substrate 11 serve to support the piezoelectric thin-film resonator. A first electrode 14, a ZnO piezoelectric film layer 15, and a second electrode 16 are formed, in that order, on film layer 12 and substrate 11. ZnO piezoelectric film layer 15 is formed at a position corresponding to air-gap 13 formed by film layer 12. First electrode 14 and second electrode 16 are so placed that at least a portion of first electrode 14 covers a portion of second electrode 16 with ZnO piezoelectric film 15 therebetween. When an electric signal is applied between first electrode 14 and second electrode 16. $SiO_2$ film layer 12 on air-gap 13 and ZnO piezoelectric film layer 15 vibrates and operates as a resonator. The material used to form piezoelectric film layer 15 is not limited to ZnO, but may be made of any piezoelectric thin-film material such as AlN or CdS.

One example of a manufacturing process for air gap 13 is as follows. A ZnO film layer is first formed through a mask at the desired location of the air-gap to be made on the substrate by using an appropriate method such as the sputtering method. By using an appropriate method (such as also the sputtering method), $SiO_2$ film layer 12 is then formed on the substrate over the ZnO film layer so that a part of the ZnO film layer is covered with the $SiO_2$ film layer and the other part of the ZnO film layer is left exposed on the substrate. The substrate is then immersed in an HCl solution. The ZnO film layer easily dissolves while the $SiO_2$ film layer remains intact. Thus, the ZnO film layer begins dissolving at its exposed portion followed by the portion under the $SiO_2$ film layer. This process forms an air-gap. Since the ZnO film layer easily dissolves in a diluted acid, liquids such as $HNO_3$, $H_3PO_4$, or $H_2SO_4$ may be used. The thickness of the air-gap need only be no more than several times the vibration displacement width at the operation frequency of the resonator. In terms of making the process easy to perform, however, it is preferable that the thickness be in the range of several hundreds angstroms to several microns. In the above description, a ZnO film material is used to form the air-gap. However, instead of ZnO, any material, such as an oxide, a piezoelectric material, a semiconductor, an insulator or a metal may be used if it can be easily dissolved. In addition, the $SiO_2$ film material does not need to be 100% pure. It may be PSG (Phospho Silicate Glass) which is a silicate glass doped to about 10% with phosphorus, or BPSG (Boro Phospho Silicate Glass), or a silicate glass doped with boron and phosphorus may also be used. Where other integrated circuits are to be assembled on the same substrate, a semiconductor such as Si or GaAs is used. Where the resonator is used as a discrete part, however, a glass or ceramic substrate may be used, thus reducing cost. Also, instead of an $SiO_2$ film, an $Si_3N_4$ film may be used to form the air-gap. Since an $Si_3N_4$ film is extremely stable both chemically and thermally, it produces good results in formation of the air-gap.

The following measured values were obtained for this type of resonator which was constructed with ZnO film layer 15 of about 4.5 microns in thickness and an $SiO_2$ film layer 12 of about 2.5 microns in thickness:

$f_r$—480 MHz $\gamma$—60

Q—500 where $f_r$ is a fundamental series resonant frequency, $\gamma$ is the capacitance ratio of static capacitance to motional capacitance and Q is the series Q-factor at resonance.

Figure 5:
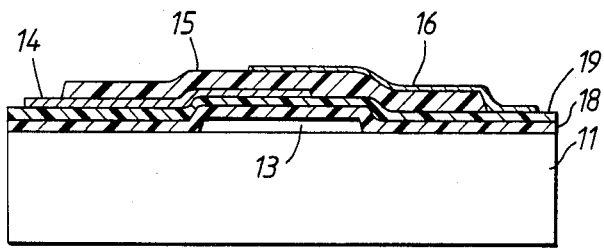
FIG. 5 is a cross-sectional view of another embodiment of a resonator in accordance with the present invention.

With reference to FIG. 5, a second embodiment of a resonator in accordance with the present invention is shown. Air-gap 13 is formed by two laminated layers consisting of $Si_3N_4$ film 18 and $SiO_2$ film 19. In this two-layer structure, the stress-strain in the air-gap is reduced and the mechanical strength is improved. Also, $SiO_2$ film 19 is used to compensate for the temperature characteristics of piezoelectric film 15.

Figure 6:
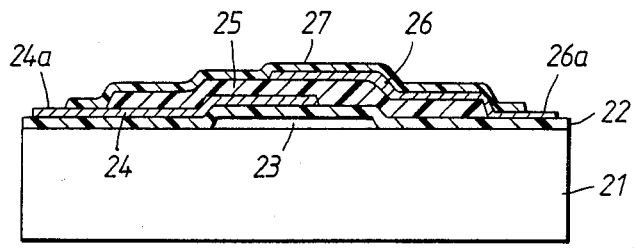
FIG. 6 is a cross-sectional view of a further embodiment of a resonator in accordance with the present invention.

FIG. 6 shows a third embodiment of the present invention. A dummy film made of ZnO (not shown) is formed on a substrate 21 through a mask so as to form an air-gap 23 when the dummy film is later removed. An $SiO_2$ film 22 is then formed on substrate 21 covering the dummy film. A portion of the dummy film, however, remains exposed. Lower electrode 24, a ZnO piezoelectric film 25 and upper electrode 26 are formed on $SiO_2$ film 22 in that order. A chemically stable dielectric film 27, such as $SiO_2$, is formed on ZnO piezoelectric film 25 and electrodes 24 and 26 except over their connecting portions 24a and 26b (and the above-mentioned exposed portion of the dummy film). The substrate is then soaked in an HCl solution in order to remove the dummy film, thereby forming an air-gap 23.

Use of the dielectric film contributes to compensation of the temperature characteristics of the ZnO piezoelectric film. It also serves to protect the ZnO piezoelectric film when the dummy film is removed. Since the dummy film is removed in the last step, the temperature distribution becomes uniform so that electrodes and film layers having good quality are obtained with uniform thickness. This is especially so if the piezoelectric film has a good orientation and a high electromechanical coupling coefficient.

The above-described resonator having a pielectric film can reduce strains caused by bending of the ZnO piezoelectric film and can increase mechanical strength so that it can withstand more severe vibrational shock. Further, when the thickness of the dielectric film layer made of $SiO_2$ is equal to that of $SiO_2$ film layer 22, the maximum point of stress is almost at the center of the ZnO piezoelectric film so that the energy conversion efficiency is improved.

The following measured values were obtained for this type of resonator which was constructed with ZnO film layer 25 of about 4.5 microns in thickness and $SiO_2$ film layers 22 and 27 of about 2.5 microns in thickness:

$f_r$—386.3 MHz
$\gamma$—54
Q—1100 where $f_r$ is a fundamental series resonant frequency, $\gamma$ is the capacitance ratio of static capacitance to motional capacitance and Q is the series Q-factor at resonance.

Figure 7:
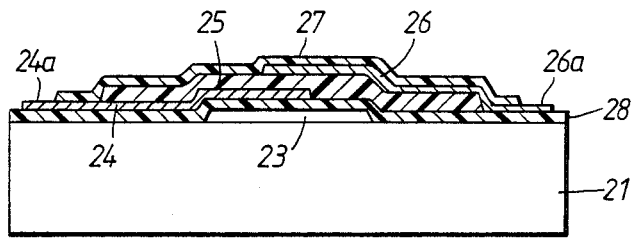
FIG. 7 is a cross-sectional view of a still further embodiment of a resonator in accordance with the present invention.

FIG. 7 shows another embodiment of the present invention. This embodiment is similar to the embodiment shown in FIG. 6 except that $SiO_2$ film layer 22 is replaced by $Si_3N_4$ film layer 28. Since the $Si_3N_4$ film layer is extremely stable, both chemically and thermally, it can be used to form an air-gap. When the same manufacuring process is used as in the previous embodiment, the upper most $SiO_2$ film layer serves as a mask for etching to create the air-gap in the last processing step. $SiO_2$ film layer 27 is also used for compensating the temperature characteristics of the ZnO piezoelectric film 25.

Figure 8:
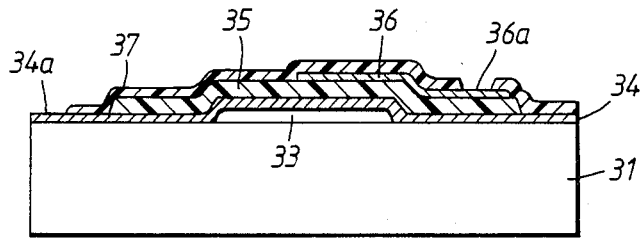
FIG. 8 is a cross-sectional view of another embodiment of a resonator in accordance with the present invention.

FIG. 8 shows a further embodiment of the present invention. According to this embodiment, an air-gap 33 is formed by a metal film 34. Metal film 34 is processed in advance so as to have an arch or concave portion corresponding to the air-gap. The metal film is then laminated on the surface of a substrate 31. This metal film 34 is also used as one of the electrodes. Piezoelectric film 35 is formed on metal film 34 and the other electrode 36 is formed on piezoelectric film 35. $SiO_2$ film layer 37 is then formed on the overall surface except contact portion 34a of metal film 34 and contact portion 36a of electrode 36. According to this embodiment, the oscilating portion of the resonator over the air-gap can be made thinner than that of the aforementioned embodiments. Thus, a higher frequency can be produced. Also, the manufacturing process is simplified by eliminating the last step of removing the dummy layer in the above embodiments.

Figure 9:
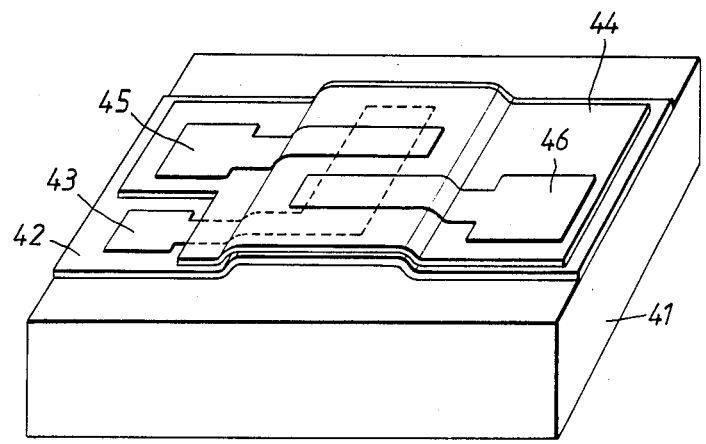
FIG. 9 is a perspective view of a resonating circuit in accordance with the present invention showing a particular electrode pattern.
Figure 10:
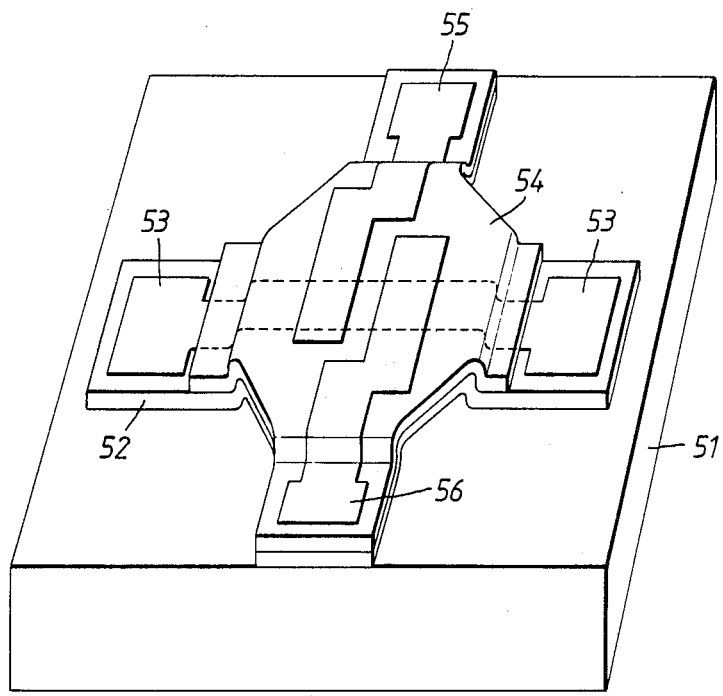
FIG. 10 is a perspective view of a resonating circuit in accordance with the present invention showing another electrode pattern.

FIGS. 9 and 10 show variations of electrode patterns for use as filters. In FIG. 9, after forming $SiO_2$ layer 42 on semiconductor substrate 41, the first electrode 43 is formed on $SiO_2$ layer 42 in an L-shaped pattern. After forming ZnO piezoelectric film 44 on $SiO_2$ film 42 and the first electrode 43, the second electrode 45 and the third electrode 46 are formed on ZnO piezoelectric film 44, each crossing perpendicular to the leg of the first electrode 43.

Since one of the upper and lower electrodes is L-shaped, the variations in size of the opposing area between the upper and lower electrodes is minimized so that variations in resonant frequency characteristics are reduced.

In FIG. 10, after forming cross-shaped $SiO_2$ layer 52 on insulating substrate 51, the lower electrode 53 extending to both sides of an air-gap is formed on $SiO_2$ film 52. ZnO piezoelectric film 54 is then formed on $SiO_2$ film 52 to form an electrical contact portion. A pair of upper electrodes 55 and 56 are formed on ZnO piezoelectric film 54 so as to cross with the lower electrode 53 on an air-gap. Thus, the resonating circuit is not substantially affected by misalignment of the electrode patterns. The circuit is supported at four locations so that mechanical strength is improved. The upper and lower electrodes may also be formed diagonally across substrate 51.

This invention has been described in detail in connection with preferred embodiments, but these embodiments are merely for example only and this invention is not restricted thereto. It will be easily understood by those skilled in the art that other variations and modifications can be easily made within the scope of the invention, as defined by the appended claims.

What is claimed is:

1. A piezoelectric resonating device comprising:
   a substrate having a substantially flat surface;
   a non-piezoelectric film layer formed on said flat surface to create an air-gap between a portion of said non-piezoelectric film layer and said flat surface;
   a first electrode formed on said non-piezoelectric film and extending along said air-gap;
   a piezoelectric film layer formed on said non-piezoelectric film layer and said first electrode; and
   a second electrode formed on said piezoelectric film layer and extending along said air-gap.

2. A piezoelectric resonating device according to claim 1 wherein said air-gap is formed by the following steps:
   forming a dummy film layer on said flat surface;
   forming said non-piezoelectric film layer on said flat surface and said dummy film layer; and
   removing said dummy film layer by soaking said flat surface in a solution which dissolves said dummy film layer.

3. A piezoelectric resonating device according to claim 1 wherein said non-piezoelectric film layer comprises $SiO_2$ film.

4. A piezoelectric resonating device according to claim 1 wherein said non-piezoelectric film layer comprises $Si_3N_4$ film.

5. A piezoelectric resonating device according to claim 1 wherein said non-piezoelectric film layer comprises $Si_3N_4$ film formed on said flat surface and a $SiO_2$ film formed on said $Si_3N_4$ film.

6. A piezoelectric resonating device according to claim 1 wherein said first electrode has a L-shaped pattern.

7. A piezoelectroc resonating device according to claim 1 wherein said second electrode has an L-shaped pattern.

8. A piezoelectric resonating device according to claim 6 wherein said second electrode includes a pair of independent electrodes.

9. A piezoelectric resonating device according to claim 1 wherein said piezoelectric film comprises a ZnO film.

10. A piezoelectric resonating device comprising:
a substrate having a substantially flat surface;
a non-piezoelectric film layer formed on said flat surface to create an air-gap between said non-piezoelectric film layer and said flat surface;
a lower electrode formed on said non-piezoelectric film layer;
a piezoelectric film layer formed on said non-piezoelectric film layer and said lower electrode;
an upper electrode formed on said piezoelectric film layer so as to interface with said lower electrode; and
a dielectric film layer formed on said piezoelectric film and said upper electrode.

11. A piezoelectric resonating device according to claim 10 wherein said air-gap is formed by the following steps:
forming a dummy film layer of said flat surface corresponding to said air-gap;
forming said non-piezoelectric film layer, said lower electrode, said piezoelectric film layer, said upper electrode and said dielectric film successively; and
soaking said flat surface in a solution which dissolves said dummy film layer so as to form said air-gap.

12. A piezoelectric resonating device according to claim 10 wherein said dielectric film layer is comprised of a $SiO_2$ film.

13. A piezoelectric resonating device according to claim 12 wherein said piezoelectric film layer is comprised of a ZnO film.

14. A piezoelectric resonating device according to claim 13 wherein said non-piezoelectric film layer is comprised of an $SiO_2$ film.

15. A piezoelectric resonating device according to claim 13 wherein said non-piezoelectric film layer is comprised of:
a $Si_3N_4$ film formed on said substrate; and
a $SiO_2$ film formed on said $Si_3N_4$ film.

16. A piezoelectric resonating device comprising:
a substrate having a substantially flat surface;
a metal film layer formed on said flat surface to create an air-gap between said flat surface and said metal film;
a piezoelectric film formed on said metal film; and
an upper electrode formed on said piezoelectric film layer.

17. A piezoelectric resonating device according to claim 15 wherein the device further comprises a dielectric film layer formed on said piezoelectric film layer and said upper electrode.

* * * * *